United States Patent
Furuya

(10) Patent No.: US 12,431,401 B2
(45) Date of Patent: Sep. 30, 2025

(54) SEMICONDUCTOR DEVICE

(71) Applicant: RENESAS ELECTRONICS CORPORATION, Tokyo (JP)

(72) Inventor: Keiichi Furuya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 500 days.

(21) Appl. No.: 17/944,678

(22) Filed: Sep. 14, 2022

(65) Prior Publication Data

US 2023/0099677 A1   Mar. 30, 2023

(30) Foreign Application Priority Data

Sep. 29, 2021   (JP) .................... 2021-159353

(51) Int. Cl.
*H01L 21/31*      (2006.01)
*H01L 21/265*     (2006.01)
(Continued)

(52) U.S. Cl.
CPC .... *H01L 23/3171* (2013.01); *H01L 21/26513* (2013.01); *H01L 21/266* (2013.01); *H01L 21/76802* (2013.01); *H01L 21/76877* (2013.01); *H01L 23/5226* (2013.01); *H01L 24/05* (2013.01); *H01L 2224/05025* (2013.01);
(Continued)

(58) Field of Classification Search
CPC .......... H01L 23/3171; H01L 21/26513; H01L 21/266; H01L 21/76802; H01L 21/76877; H01L 23/5226; H01L 24/05; H01L 2224/05025; H01L 2224/05124;
(Continued)

(56) References Cited

U.S. PATENT DOCUMENTS

| | | | |
|---|---|---|---|
| 8,373,270 B2 | 2/2013 | Homma et al. | |
| 9,508,774 B2 | 11/2016 | Iizuka | |
| 2011/0272664 A1* | 11/2011 | Tada | H10N 70/826 |
| | | | 257/4 |

FOREIGN PATENT DOCUMENTS

| | | |
|---|---|---|
| JP | 2007-053124 A | 3/2007 |
| JP | 2010-251537 A | 11/2010 |

(Continued)

OTHER PUBLICATIONS

Office Action dated Dec. 24, 2024, from corresponding Japanese Patent Application No. 2021-159353, 10 pages.

*Primary Examiner* — Thanh T Nguyen
(74) *Attorney, Agent, or Firm* — Rimon P.C.

(57) ABSTRACT

A semiconductor device includes a semiconductor substrate having a first main surface and a second main surface, a plurality of wirings which are layered over the first main surface in a thickness direction that is a direction extending from the second main surface to the first main surface, and a passivation film which covers a top wiring that is a wiring being at a farthest position from the first main surface in the thickness direction, of the plurality of wirings. The top wiring has a first linear portion linearly extending along a first direction from a termination portion of the top wiring. The passivation film has a first dummy opening, the first dummy opening penetrating the passivation film in the thickness direction. The first dummy opening is disposed so as to overlap with an end portion of the first linear portion on the termination portion side, in plan view.

11 Claims, 15 Drawing Sheets

(51) Int. Cl.
  *H01L 21/266* (2006.01)
  *H01L 21/768* (2006.01)
  *H01L 23/00* (2006.01)
  *H01L 23/31* (2006.01)
  *H01L 23/522* (2006.01)

(52) U.S. Cl.
  CPC ............... *H01L 2224/05124* (2013.01); *H01L 2924/3512* (2013.01)

(58) Field of Classification Search
  CPC ....... H01L 2924/3512; H01L 23/53295; H01L 23/562; H01L 23/5329
  See application file for complete search history.

(56) References Cited

FOREIGN PATENT DOCUMENTS

| | | | | |
|---|---|---|---|---|
| JP | 2014-110279 A | 6/2014 | | |
| KR | 100861305 | * 10/2008 | ............. | H01L 21/82 |

* cited by examiner

SEMICONDUCTOR DEVICE

CROSS-REFERENCE TO RELATED APPLICATION

The disclosure of Japanese Patent Application No. 2021-159353 filed on Sep. 29, 2021, including the specification, drawings and abstract is incorporated herein by reference in its entirety.

BACKGROUND

The present invention relates to a semiconductor device.
There are disclosed techniques listed below.
[Patent Document 1] Japanese Unexamined Patent Application Publication No. 2007-053124

For example, Patent Document 1 discloses a semiconductor device. The semiconductor device disclosed in Patent Document 1 has a semiconductor substrate, a plurality of wirings, and a passivation film.

The semiconductor substrate has a first main surface, and a second main surface that is an opposite surface of the first main surface. A direction extending from the second main surface to the first main surface is set as a thickness direction. The plurality of wirings are layered on the first main surface in the thickness direction. A wiring of the plurality of wirings which is farthest from the first main surface in the thickness direction (that is, a wiring in an uppermost layer) is referred to as a top wiring. The passivation film covers the top wiring.

SUMMARY

In the semiconductor device disclosed in Patent Document 1, when a temperature cycle is applied, due to a difference in coefficient of thermal expansion between the top wiring and the passivation film, a crack may occur in the passivation film along an extending direction of the top wiring. A developing direction of this crack may change in a vicinity of a terminal portion of the top wiring, for example, and may reach a side surface of the top wiring. When this crack reaches the side surface of the top wiring, short-circuiting may occur between adjacent ones of the top wirings under a high temperature and high humidity environmental condition.

The present disclosure provides a semiconductor device capable of stopping development of a crack generated in a passivation film before a developing direction of the crack changes.

A semiconductor device according to one embodiment includes a semiconductor substrate having a first main surface and a second main surface that is an opposite surface of the first main surface, a plurality of wirings which are layered over the first main surface in a thickness direction that is a direction extending from the second main surface to the first main surface, and a passivation film which covers a top wiring that is a wiring being at a farthest position from the first main surface in the thickness direction, of the plurality of wirings. The top wiring has a first linear portion linearly extending along a first direction from a termination portion of the top wiring. The passivation film has a first dummy opening formed therein, the first dummy opening penetrating the passivation film in the thickness direction. The first dummy opening is disposed so as to overlap with an end portion of the first linear portion on the termination portion side, in plan view.

According to the semiconductor device of one embodiment, it is possible to stop development of a crack generated in a passivation film before a developing direction of the crack changes.

BRIEF DESCRIPTIONS OF THE DRAWINGS

FIG. 1 is a plan view of a semiconductor device according to a first embodiment of the present disclosure.
FIG. 2 is a cross-sectional view taken along a line II-II in FIG. 1.
FIG. 3 is an enlarged view of a dashed frame III in FIG. 2.
FIG. 4 is a process diagram indicating a method of manufacturing the semiconductor device according to the first embodiment of the present disclosure.
FIG. 5 is a cross-sectional view for describing a first ion implantation step.
FIG. 6 is a cross-sectional view for describing an element isolation film formation step.
FIG. 7 is a cross-sectional view for describing a gate insulating film formation step.
FIG. 8 is a cross-sectional view for describing a gate formation step.
FIG. 9 is a cross-sectional view for describing a second ion implantation step.
FIG. 10 is a cross-sectional view for describing a sidewall spacer formation step.
FIG. 11 is a cross-sectional view for describing a third ion implantation step.
FIG. 12 is a cross-sectional view for describing a first interlayer insulating film formation step.
FIG. 13 is a cross-sectional view for describing a contact plug formation step.
FIG. 14 is a cross-sectional view for describing a first wiring formation step.
FIG. 15 is a cross-sectional view for describing second interlayer insulating film formation step.
FIG. 16 is a cross-sectional view for describing a first via plug formation step.
FIG. 17 is a cross-sectional view for describing a second wiring formation step.
FIG. 18 is a cross-sectional view for describing a third interlayer insulating film formation step.
FIG. 19 is a cross-sectional view for describing a second via plug formation step.
FIG. 20 is a cross-sectional view for describing a third wiring formation step.
FIG. 21 is a cross-sectional view for describing a passivation film formation step.
FIG. 22 is a plan view of a semiconductor device according to a comparative example.
FIG. 23 is a cross-sectional view taken along a line XXIII-XXIII in FIG. 22.
FIG. 24 is a plan view of the semiconductor device according to a first modification of the first embodiment.
FIG. 25 is a cross-sectional view of the semiconductor device according to a second modification of the first embodiment.
FIG. 26 is a cross-sectional view of the semiconductor device according to a third modification of the first embodiment.
FIG. 27 is a plan view of a semiconductor device according to a second embodiment of the present disclosure.
FIG. 28 is a plan view of the semiconductor device according to a first modification of the second embodiment.

DETAILED DESCRIPTION

Embodiments of the present disclosure will be described in detail with reference to the accompanying drawings. In the following drawings, components having the same or similar function are denoted by the same reference symbols, and the repetitive description thereof is omitted.

First Embodiment

A semiconductor device according to a first embodiment will be described. The semiconductor device according to the first embodiment is set as a semiconductor device DEV1.
Configuration of Semiconductor Device DEV1

Hereinafter, a configuration of the semiconductor device DEV1 will be described.

Figure 1:
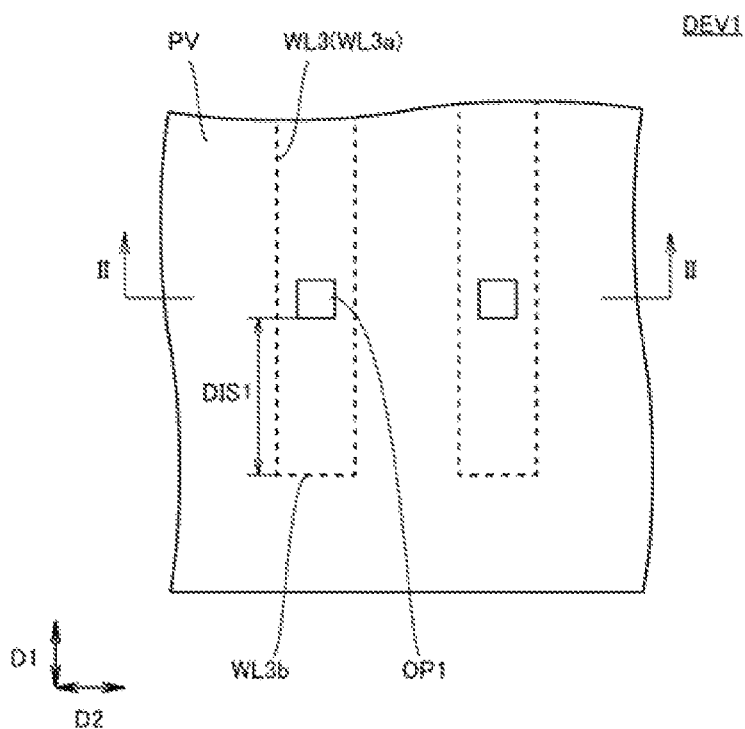
Figure 2:
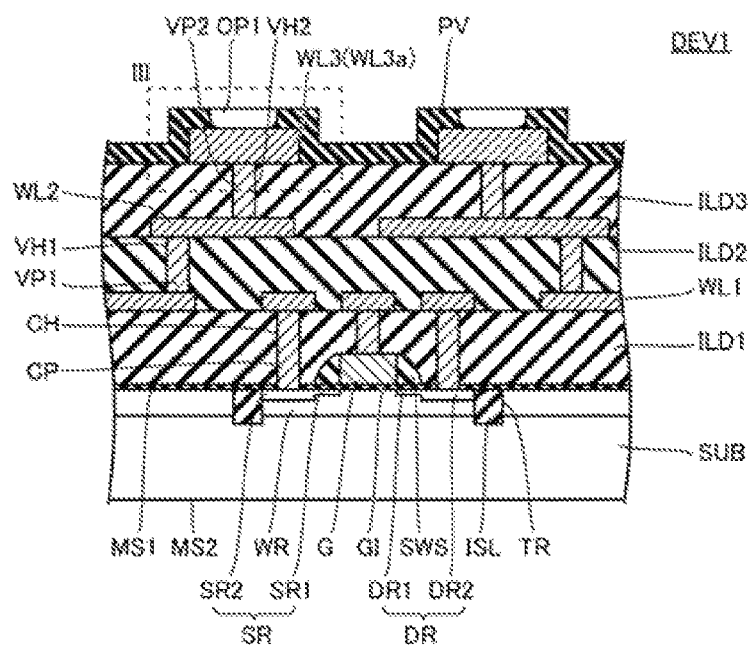
Figure 3:
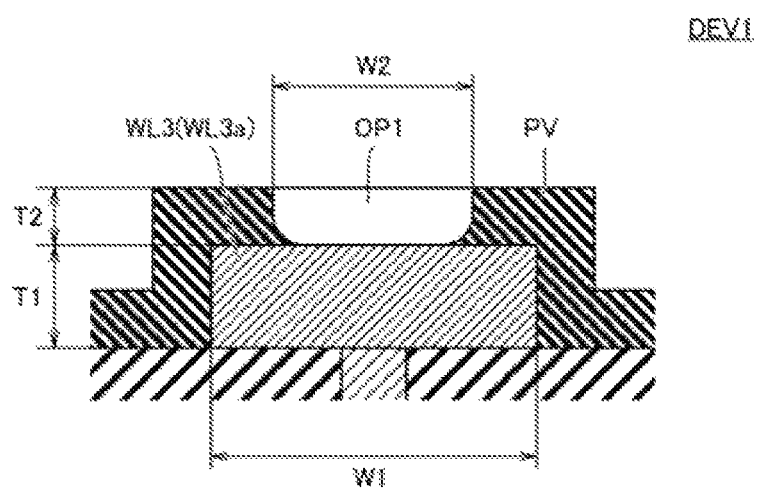

FIG. 1 is a plan view of the semiconductor device DEV1 according to the first embodiment. FIG. 2 is a cross-sectional view taken along a line II-II in FIG. 1. FIG. 3 is an enlarged view of a dashed frame III in FIG. 2. As shown in FIG. 1 to FIG. 3, the semiconductor device DEV1 includes a semiconductor substrate SUB, an element isolation film ISL, a gate insulating film GI, a gate G, sidewall spacers SWS, an interlayer insulating film ILD1, contact plugs CP, wirings WL1, an interlayer insulating film ILD2, via plugs VP1, wirings WL2, an interlayer insulating film ILD3, via plugs VP2, wirings WL3, a passivation film PV.

The semiconductor substrate SUB has a first main surface MS1 and a second main surface MS2. The first main surface MS1 and the second main surface MS2 each constitutes an end surface in a thickness direction of the semiconductor substrate SUB. The second main surface MS2 is an opposite surface of the first main surface MS1. A direction extending from the second main surface MS2 to the first main surface MS1 is set as the thickness direction. The semiconductor substrate SUB is formed of single-crystal silicon (Si), for example.

The semiconductor substrate SUB has a well region WR, a source region SR, and a drain region DR formed therein. Each of the source region SR and the drain region DR is doped with a dopant such that each conductivity type becomes a first conductivity type. The well region WR is doped with a dopant such that its conductivity type becomes a second conductivity type. The first conductivity type is, for example, an n-type. The second conductivity type is a conductivity type that is opposite to the first conductivity type. That is, in a case in which the first conductivity type is the n-type, for example, the second conductivity type is a p-type.

The well region WR is formed in the first main surface MS1. Each of the source region SR and the drain region DR is formed in the first main surface MS1 so as to be surrounded by the well region WR. The source region SR and the drain region DR are spaced apart from each other.

The source region SR has a first portion SR1 and a second portion SR2. The first portion SR1 is positioned closer to the drain region DR than the second portion SR2. An impurity concentration of the second portion SR2 is higher than an impurity concentration of the first portion SR1. That is, the source region. SR has an LDD (Lightly Doped Diffusion) structure.

The drain region DR has a first portion DR1 and a second portion DR2. The first portion DR1 is positioned closer to the source region SR than the second portion DR2. An impurity concentration of the second portion DR2 is higher than an impurity concentration of the first portion DR1. That is, the drain region DR has the LDD structure.

In the first main surface MS1, trenches TR are formed. Each of the trenches TR extends from the first main surface MS1 to the second main surface MS2 side. Although not illustrated, the trenches TR are formed so as to surround the well region WR, in plan view. The element isolation film ISL is buried in each of the trenches TR. The element isolation film ISL is formed of, for example, silicon oxide ($SiO_2$). In this manner, STI (Shallow Trench Isolation) is formed. Note that, in this example, the element isolation is formed by the STI, but the element isolation may be formed by LOCOS (LOCal Oxidation Of Silicon).

The gate insulating film GI is disposed on the first main surface MS1. The gate insulating film GI formed of silicon oxide, for example. The gate G is disposed on the gate insulating film GI. More specifically, the gate G is opposed to a portion of the first main surface MS1 between the source region SR and the drain region DR with the gate insulating film GI interposed between the gate G and this portion. The gate G is formed of polycrystalline silicon doped with impurities, for example. The well region WR, the source region SR, the drain region DR, the gate insulating film GI, and the gate C constitutes a transistor.

The sidewall spacers SWS are disposed on the gate insulating film GI. More specifically, the sidewall spacers SWS are each disposed on a portion of the gate insulating film GI covering the first portion SR1 and on a portion of the gate insulating film GI covering the first portion DR1. The sidewall spacers SWS are formed in contact with side surfaces of the gate G. The sidewall spacers SWS are formed of silicon nitride (SiN), for example.

The interlayer insulating film ILD1 is disposed over the first main surface MS1 so as to cover the gate insulating film GI, the gate C, and the sidewall spacers SWS. The interlayer insulating film ILD1 formed of silicon oxide, for example.

The interlayer insulating film ILD1 has contact holes CH formed therein. The contact holes CH penetrate the interlayer insulating film ILD1 along the thickness direction. The contact holes CH further penetrate the gate insulating film GI as well. Each of the source region the drain region DR, and the gate G is exposed in each of the contact holes CH. Note that, although not illustrated, each portion of the source region SR, the drain region DR, and the gate G that is exposed in each of the contact holes CH may be silicided.

The contact plugs CP are each buried in each of the contact holes CH. The contact plugs CP are formed of tungsten (W), for example. Each of the contact plugs CP is electrically connected with each of the source region. SR, the drain region DR, and the gate G. Note that, although not illustrated, for example, a barrier metal formed of titanium (Ti) and titanium nitride (TiN) may be disposed between an inner wall surface of each of the contact holes CH: and each of the contact plugs CP.

Each of the wirings WL1 is disposed on the interlayer insulating film ILD1. Each of the wirings WL1 is electrically connected with each of the contact plugs CP. The wirings WL1 are formed of, for example, aluminum (Al) or an aluminum alloy. Note that, although not illustrated, a barrier metal formed of titanium and titanium nitride may be disposed between the interlayer insulating film ILD1 and each of the wirings WL1. Also, although not illustrated, on each of the wirings WL1, an antireflective film formed of titanium nitride may be formed.

The interlayer insulating film ILD2 is disposed over the interlayer insulating film ILD1 so as to cover the wirings WL1. The interlayer insulating film ILD2 is formed of silicon oxide, for example. The interlayer insulating film ILD2 has via holes VH1 formed therein. The via holes VH1 penetrate the interlayer insulating film ILD2 along the thickness direction. Each of the wirings WL1 is exposed in each of the via holes VH1. In the via holes VH1, the via plugs VP1 are buried.

The via plugs VP1 are each electrically connected with each of the wirings WL1. The via plugs VP1 are formed of tungsten, for example. Although not illustrated, a barrier metal formed of titanium and titanium nitride may be disposed between an inner wall surface of each of the via holes VH1 and each of the via plugs VP1.

Each of the wirings WL2 is disposed on the interlayer insulating ILD2. Each of the wirings WL2 is electrically connected with each of the via plugs VP1. The wirings WL2 are formed of aluminum or an aluminum alloy, for example. Note that, although not illustrated, a barrier metal formed of titanium and titanium nitride may be disposed between the interlayer insulating film ILD2 and each of the wirings WL2. Also, although not illustrated, an antireflective film formed of titanium nitride may be formed on each of the wirings WL2.

The interlayer insulating film ILD3 is disposed over the interlayer insulating film ILD2 so as to cover the wirings WL2, The interlayer insulating film ILD3 is formed of silicon oxide, for example. The interlayer insulating film ILD3 has via holes VH2 formed therein. The via holes VH2 penetrate the interlayer insulating film ILD3 along the thickness direction. Each of the wirings WL2 is exposed in each of the via holes VH2. The via plugs VP2 are buried in the via holes VH2.

The via plugs VP2 are each electrically connected with each of the wirings WL2. The via plugs VP2 are formed of tungsten, for example. Although not illustrated, a barrier metal formed of titanium and titanium nitride is disposed between an inner wall surface of each of the via holes VH2 and each of the via plugs VP2.

Each of the wirings WL3 is disposed on the interlayer insulating film ILD3. Each of the wirings WL3 is electrically connected with each of the via plugs VP2. The wirings WL3 are formed of, for example, aluminum or an aluminum alloy. Note that, although not illustrated, a barrier metal formed of titanium and titanium nitride may be disposed between the interlayer insulating film ILD3 and each of the wirings WL3.

As described above, a plurality of wirings (the wirings WL1, the wirings WL2, and the wirings WL3) are disposed in layers over the first main surface MS1 in the thickness direction, and the wirings WL3 are farthest from the first main surface MS1 in this layered structure. That is, the wirings WL3 are each a top wiring. In the above description, the number of layers disposed over the first main surface MS1 is set to 3, but the number of layers disposed over the first main surface MS1 may be 2 or 4 or more.

Each of the wirings WL3 has a linear portion WL3a. The linear portion WL3a linearly extends along a first direction D1 from a termination portion WL3b of each of the wirings WL3, in plan view. Note that, although not illustrated, each of the wirings WL3 has bonding pad portions.

A width of each of the wirings WL3 is set as a width W1. A thickness of each of the wirings WL3 is set as a thickness T1. Preferably, the width W1 is 2.0 times or more and 3.4 times or less the thickness T1. The thickness T1 is preferably 3.0 μm or more.

The passivation film PV is disposed over the interlayer insulating film ILD3 so as to cover the wirings WL3. The passivation film PV is formed of silicon nitride, for example. The passivation film PV may be formed of silicon oxynitride (SiON). The passivation film PV has a dummy opening OP1 formed therein. The dummy opening OP1 penetrates the passivation film PV along the thickness direction. The linear portion WL3a is exposed in the dummy opening OP1.

The dummy opening OP1 is disposed so as to overlap with an end portion of the linear portion WL3a on the termination portion WL3b side. The dummy opening OP1 is spaced from the termination portion WL3b. A distance between the termination portion WL3b of the wiring WL3 and the dummy opening OP1 in the first direction D1 is set as a distance DIS1. Preferably, the distance DIS1 is 2.0 μm or more and 2.7 μm or less. An opening width of the dummy opening OP1 in a second direction D2 is set as an opening width W2. The second direction D2 is a direction orthogonal to the first direction D1. A thickness of the passivation film PV is set as a thickness T2. The opening width W2 is preferably 2.0 times or more the thickness T2. The opening width W2 is smaller than the width W1.

The passivation film PV has other openings than the dummy opening OP1 formed therein, each of the openings exposing each of the bonding pad portions of each of the wirings WL3. That is, the dummy opening OP1 is distinguished from the openings in the passivation film PV, each of the openings exposing each of the bonding pad portions of each of the wirings WL3. The dummy opening OP1 has a rectangular shape, for example, in plan view.

Method of Manufacturing Semiconductor Device DEV1

In the following, a method of manufacturing the semiconductor device DEV1 will be described.

Figure 4:
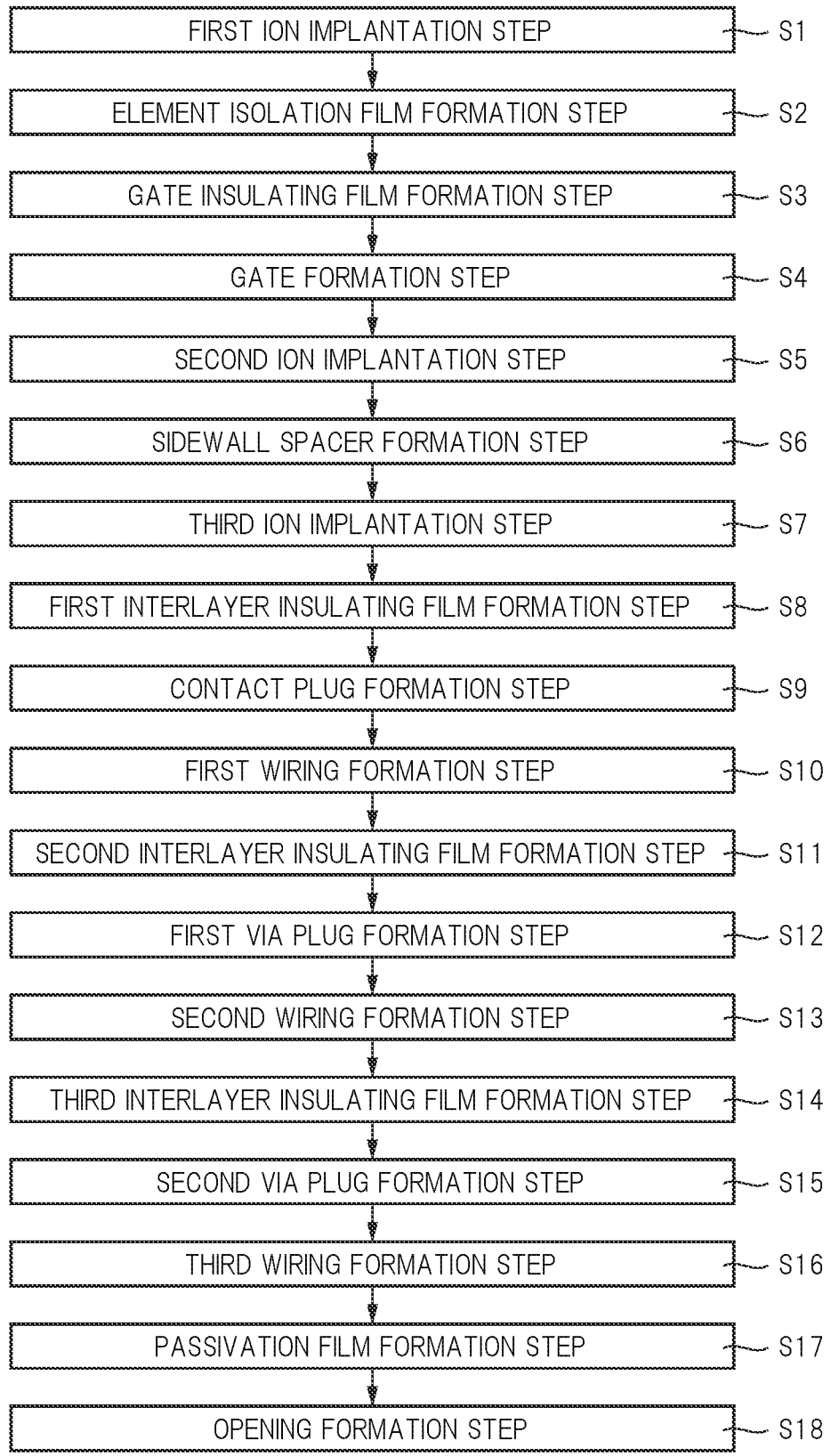

FIG. 4 is a process diagram indicating a method of manufacturing the semiconductor device DEV1. As shown in FIG. 4, the method of manufacturing the semiconductor device DEV1 includes a first ion implantation step S1, an element isolation film formation step S2, a gate insulating film formation step S3, a gate formation step S4, a second ion implantation step S5, a sidewall spacer formation step S6, and a third ion implantation step S7.

The method of manufacturing the semiconductor device DEV1 further includes a first interlayer insulating film formation step S8, a contact plug formation step S9, a first wiring formation step S10, a second interlayer insulating film formation step S11, a first via plug formation step S12, a second wiring formation step S13, a third interlayer insulating film formation step S14, a second via plug formation step S15, a third wiring formation step S16, a passivation film formation step S17, and an opening formation step S18.

Figure 5:

FIG. 5 is a cross-sectional view for describing the first ion implantation step S1, As shown in FIG. 5, in the first ion implantation step S1, ion implantation is performed, and accordingly, the well region WR is formed.

Figure 6:
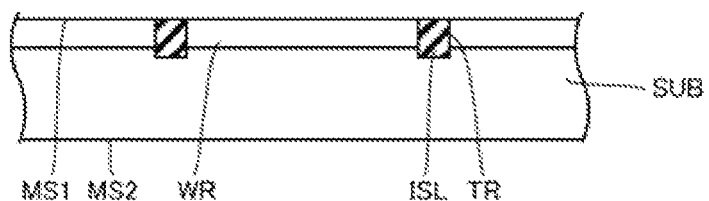

FIG. 6 is a cross-sectional view for describing the element isolation film formation step S2. As shown in FIG. 6, in the element isolation film formation step S2, first, the trenches TR are formed. Formation of the trenches TR is performed by dry etching. Secondly, A constituent material of the element isolation film ISL is buried in each of the trenches TR. Burying the constituent material of the element isolation film ISL is performed by CVD (Chemical Vapor Deposition), for example.

Thirdly, the constituent material of the element isolation film ISL excessively sticking out from the trench TR is removed. Removal of the constituent material of the element isolation film ISL excessively sticking out from each of the trenches TR is performed by CMP (Chemical Mechanical Polishing), for example.

Figure 7:
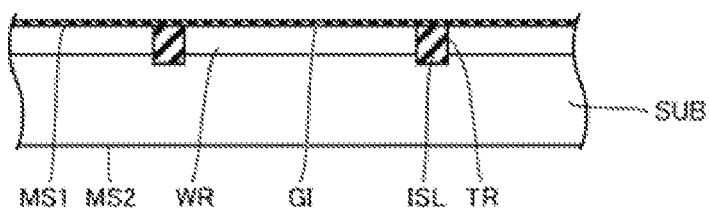

FIG. 7 is a cross-sectional view for describing the gate insulating film formation step S3. As shown in FIG. 7, in the gate insulating film formation step S3, the gate insulating film GI is formed. Formation of the gate insulating film GI is performed by thermal oxidation of the first main surface MS1.

Figure 8:
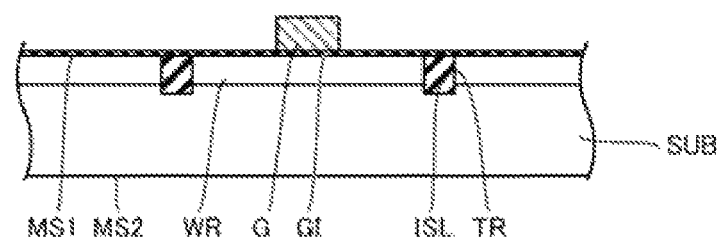

FIG. 8 is a cross-sectional view for describing a gate formation step S4, and in the gate formation step S4, the gate G is formed. In the gate formation step S4, first, a constituent material of the gate G is formed on the gate insulating film GI. This film-formation is performed by the CVD, for example. Secondly, the formed constituent material of the gate G is patterned. This patterning is performed by photolithography and dry etching.

Figure 9:
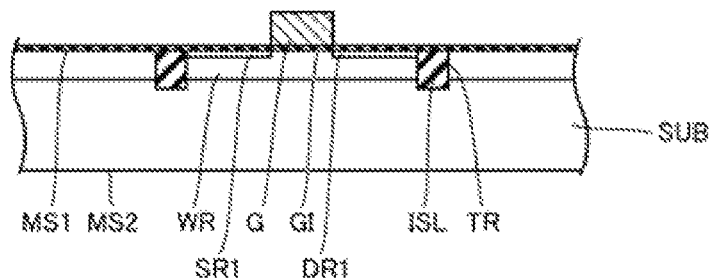

FIG. 9 is a cross-sectional view for describing a second ion implantation step S5. As shown in FIG. 9, in the second ion implantation step S5, with the element isolation film ISL and the gate G used as a mask, ion implantation is performed, and accordingly, the first portion SR1 and the first portion DR1 are formed.

Figure 10:
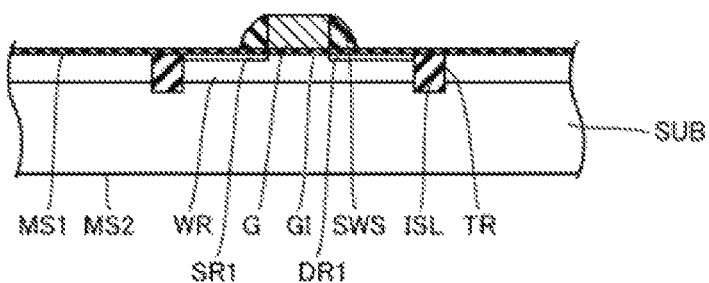

FIG. 10 is a cross-sectional view for describing a sidewall spacer formation step S6. As shown in FIG. 10, in the sidewall spacer formation step S6, the sidewall spacers SWS are formed. In the sidewall spacer formation step S6, first, a constituent material of the sideway spacers SWS is formed on the gate insulating film GI so as to cover the gate G. Secondly, the formed constituent material of the sidewall spacers SWS is etched back.

Figure 11:
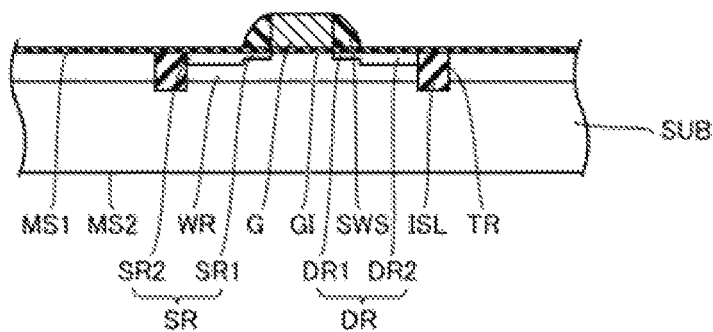

FIG. 11 is a cross-sectional view for describing a third ion implantation step S7. In the third ion plantation step S7, as shown in FIG. 11, ion implantation is performed, and accordingly, the second portion SR2 and the second portion DR2 are formed.

Figure 12:
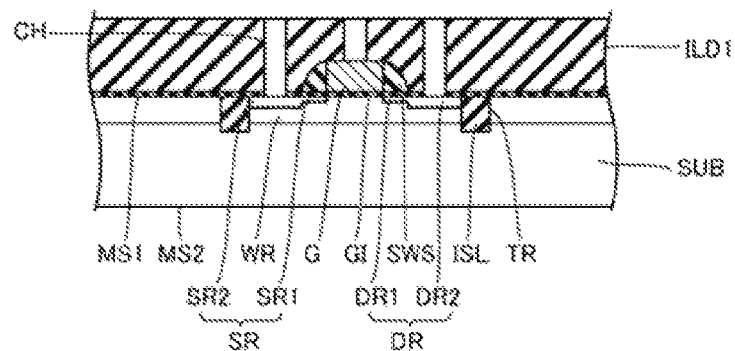

FIG. 12 is a cross-sectional view for describing a first interlayer insulating film formation step S8. As shown in FIG. 12, in the first interlayer insulating film formation step S8, the interlayer insulating film ILD1 is formed. In the first interlayer insulating film formation step S8, first, a constituent material of the interlayer insulating film ILD1 is formed so as to cover the gate insulating film GI, the sidewall spacers SWS, and the gate G. This formation is performed by, for example, the CVD. Secondly, the formed constituent material of the interlayer insulating film ILD1 is planarized by the CMP, for example. Hence, the interlayer insulating film ILD1 is formed. Thirdly, dry etching is performed on the interlayer insulating film ILD1 and the gate insulating film GI, thereby forming the contact holes CH in each of the interlayer insulating film ILD1 and the gate insulating film GI.

Figure 13:
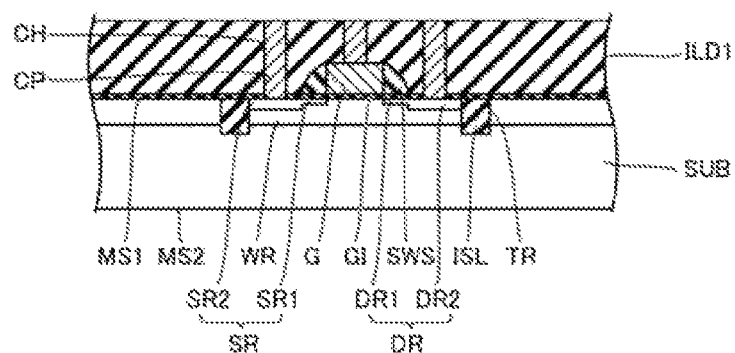

FIG. 13 is a cross-sectional view for describing the contact plug formation step S9. As shown in FIG. 13, in the contact plug formation step S9, the contact plugs CP are formed. In the contact plug formation step S9, first, a constituent material of each of the contact plugs CP is buried in each of the contact holes CH by the CVD or other methods. Secondly, the constituent material of each of the contact plugs CP excessively sticking out from each of the contact holes CH is removed by the CMP, for example.

Figure 14:
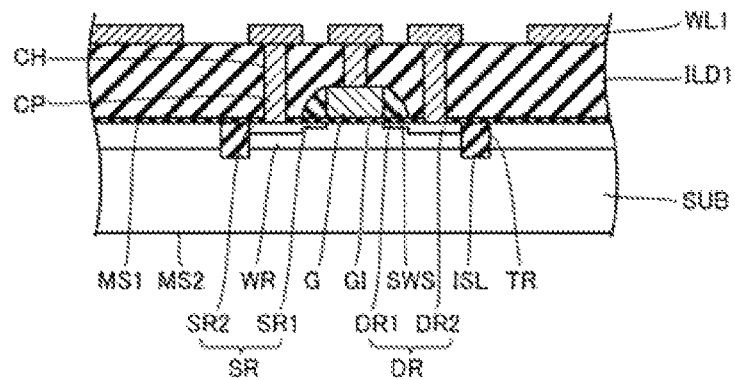

FIG. 14 is a cross-sectional view for describing the first wiring formation step S10. In the first wiring formation step S10, as shown in FIG. 14, the wirings WL1 are formed. In the first wiring formation step S10, first, a constituent material of each of the wirings WL1 is formed by sputtering or other methods. Secondly, the formed constituent material of each of the wirings WL1 is patterned by, for example, photolithography and etching.

Figure 15:
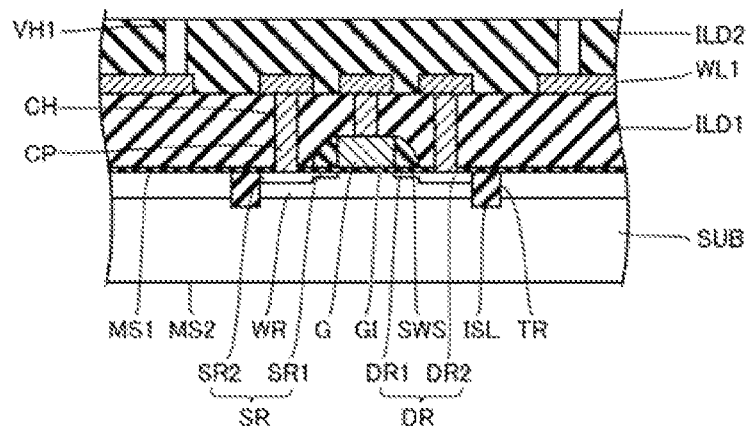

FIG. 15 is a cross-sectional view for describing the second interlayer insulating film formation step S11. As shown in FIG. 15, in the second interlayer insulating film formation step S11, the interlayer insulating film ILD2 is formed. In the second interlayer insulating film formation step S11, first, a constituent material of the interlayer insulating film ILD2 is formed on the interlayer insulating film ILD1 so as to cover the wirings WL1. This formation is performed by the CVD, for example. Secondly, the formed constituent material of the interlayer insulating film ILD2 is planarized by the CMP, for example. Hence, the interlayer insulating film ILD2 is formed. Thirdly, dry etching is performed on the interlayer insulating film ILD2, thereby forming the via holes VH1 in the interlayer insulating film ILD2.

Figure 16:
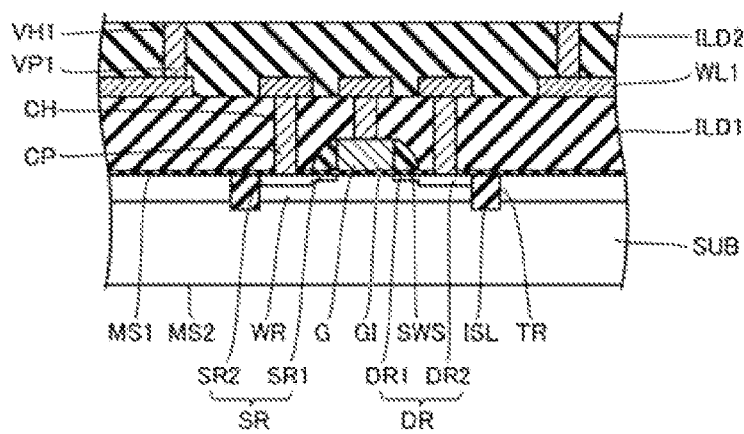

FIG. 16 is a cross-sectional view for describing the first via plug formation step S12. As shown in FIG. 16, in the first via plug formation step S12, the via plugs VP1 are formed. In the first via plug formation step S12, first, a constituent material of each of the via plugs VP1 is buried in each of the via holes VH1 by the CVD, for example, Secondly, the constituent material of each of the via plugs VP1 excessively sticking out from each of the via holes VH1 is removed by CMP, for example.

Figure 17:
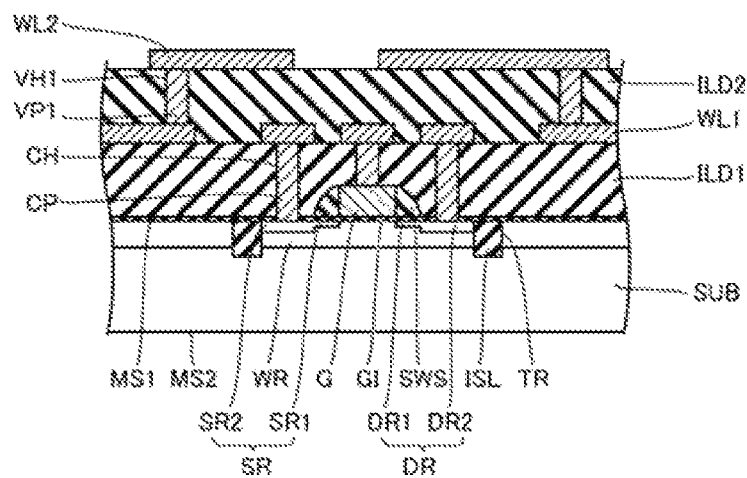
Figure 18:
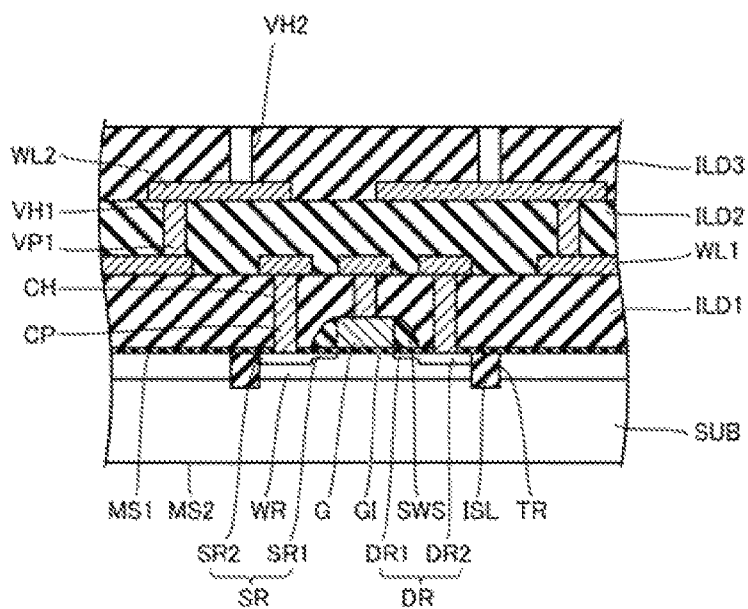
Figure 19:
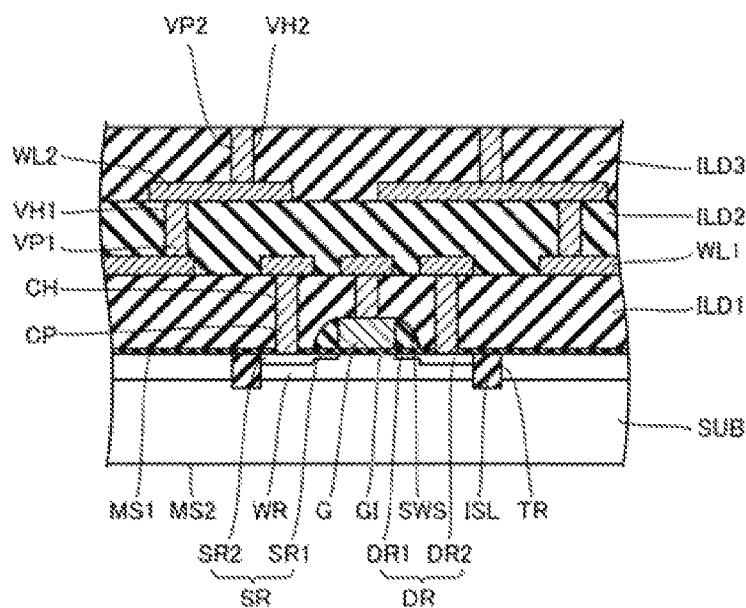
Figure 20:
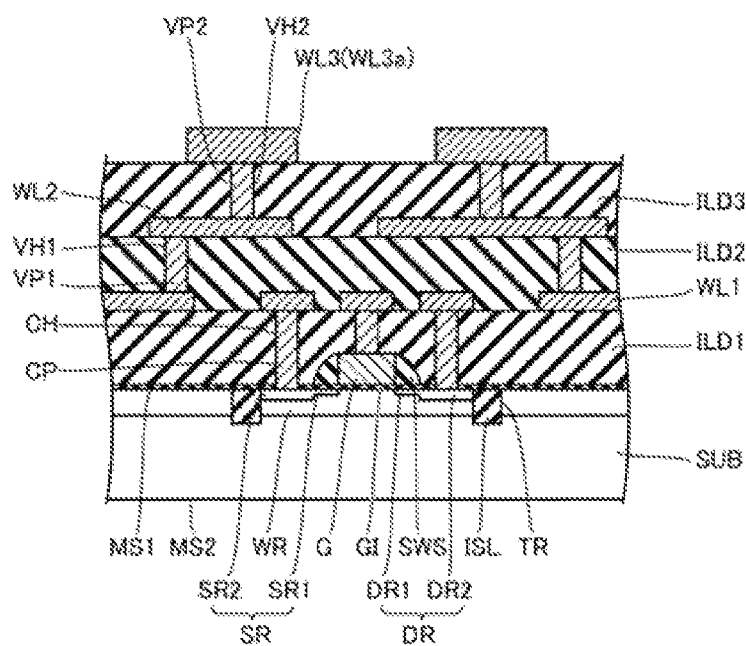

FIG. 17 is a cross-sectional view for describing the second wiring formation step S13. In the second wiring formation step S13, as shown in FIG. 17, the wirings WL2 are formed. FIG. 18 is a cross-sectional view for describing the third interlayer insulating film formation step S14. In the third interlayer insulating film formation step S14, as shown in FIG. 18, the interlayer insulating film ILD3 is formed. FIG. 19 is a cross-sectional view for describing the second via plug formation step S15. In the second via plug formation step S15, as shown in FIG. 19, the via plugs VP2 are formed. FIG. 20 is a cross-sectional view for describing the third wiring formation step S16. In the third wiring formation step S16, as shown in FIG. 20, the wirings WL3 are formed.

The method of forming the wirings WL2 and the wirings WL3 is similar to the method of forming the wirings WL1. The method of forming the interlayer insulating film ILD3 is similar to the method of forming the interlayer insulating film ILD2. The method of forming the via plugs VP2 is similar to the method of forming the via plugs VP1.

Figure 21:
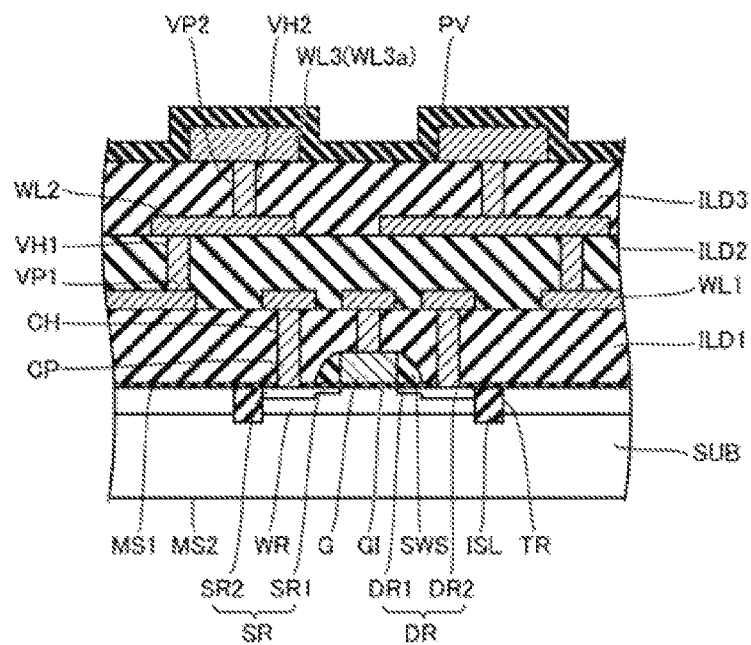

FIG. 21 is a cross-sectional view for describing the passivation film formation step S17. As shown in FIG. 21, in the passivation film formation step S17 the passivation film PV is formed. Formation of the passivation film PV is performed by the CVD, for example. In the opening formation step S18, the dummy opening OP1 is formed. Note that, in the opening formation step S18, the openings exposing the bonding pad portions of each of the wirings WL3 is also formed. Formation of the dummy opening OP1 is performed by forming a resist having been patterned by photolithography, and with the resist used as a mask, performing wet etching on the passivation film PV. As described above, the semiconductor device DEV1 having a structure shown in FIG. 1 to FIG. 3 is formed.

Effect of Semiconductor Device DEV1

In the following, an effect of the semiconductor device DEV1 will be described in comparison with a comparative example. A semiconductor device according to the comparative example is referred to as a semiconductor device DEV2.

Figure 22:
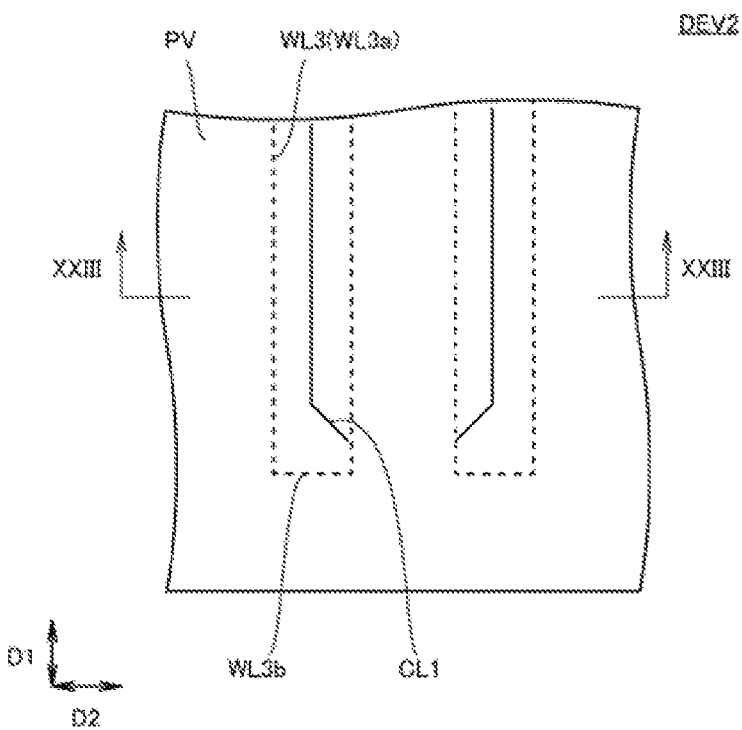
Figure 23:
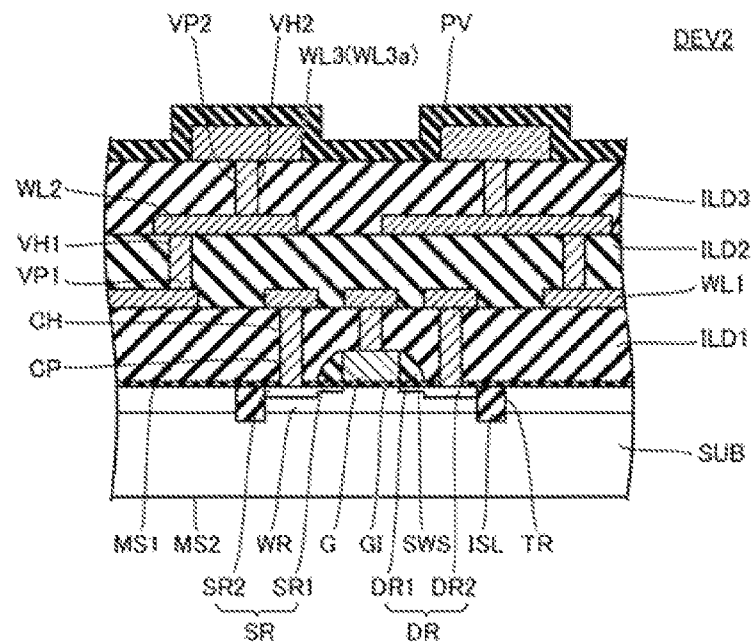

FIG. 22 is a plan view of the semiconductor device DEV2 according to the comparative example. FIG. 23 is a cross-sectional view taken along a line XXIII-XXIII in FIG. 22. As shown in FIG. 22 and FIG. 23, the semiconductor device DEV2 has a configuration similar to the semiconductor device DEV1 except that the dummy opening OP1 is not formed in the passivation film PV.

When a temperature cycle is applied to the semiconductor device DEV2, due to a difference in coefficient of thermal expansion between each of the wirings WL3 and the passivation film PV, a crack CL1 (see FIG. 22) may occur in a portion of the passivation film PV covering the linear portion WL3a. Generation of the crack CL1 is often likely to be caused particularly in a case in which the thickness T1 of the wiring WL3 is 2.0 times or more and 3.4 times or less the width W1 of the wiring WL3. The crack CL1 develops along the first direction D1 and advances toward the termination portion WL3b.

However, the developing direction of the crack CL1 changes in the vicinity of the termination portion WL3b, and the crack CL1 may reach a side surface of the wiring WL3. When the crack CL1 reaches the side surface of the wiring WL3, corrosion of the wirings WL3 under a high temperature and high humidity environmental condition may cause short-circuiting between adjacent ones of the wirings WL3. Also, the crack CL1 further passes through the interlayer insulating film ILD3 and then reaches the via plug VP2, causing the via plug VP2 to be open.

Also in the semiconductor device DEV1, the similar crack CL1 may occur in the passivation film PV. However, in the semiconductor device DEV1, the passivation film PV has the dummy opening OP1 formed therein, and accordingly, the crack CL1 is stopped by the dummy opening OP1 before the developing direction of the crack CL1 changes. Thus, according to the semiconductor device DEV1, it is possible to prevent occurrence of a failure caused by short-circuiting between adjacent ones of the wirings WL3 and open of the via plug VP2.

In a case in which the distance DIS1 is 2.0 μm or more and 2.7 μm or less, it is possible to stop the development of the crack CL1 more reliably before the developing direction of the crack CL1 changes.

First Modification

Figure 24:
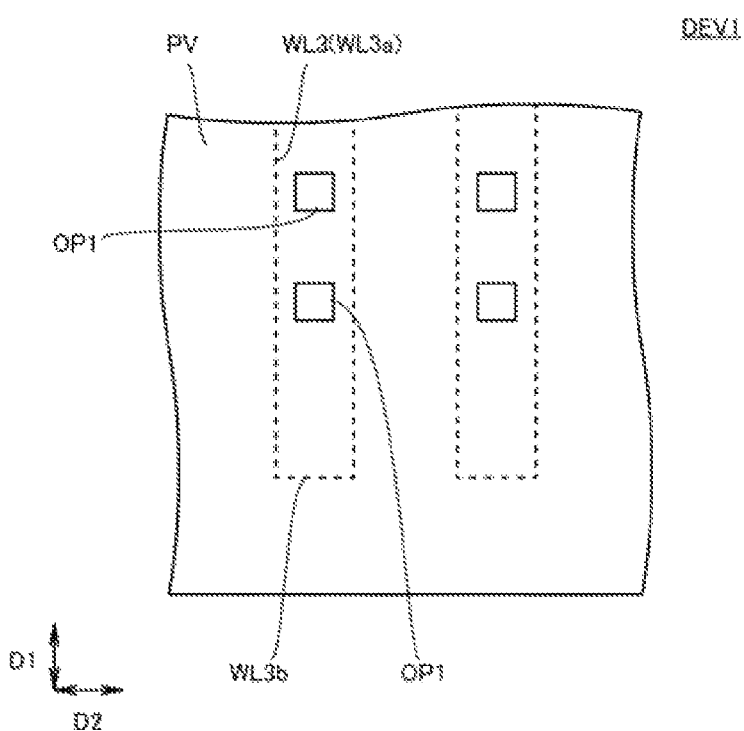

FIG. 24 is a plan view of the semiconductor device DEV1 according to a first modification of the first embodiment. As shown in FIG. 24, the number of dummy openings OP1 may be plural.

Second Modification

Figure 25:
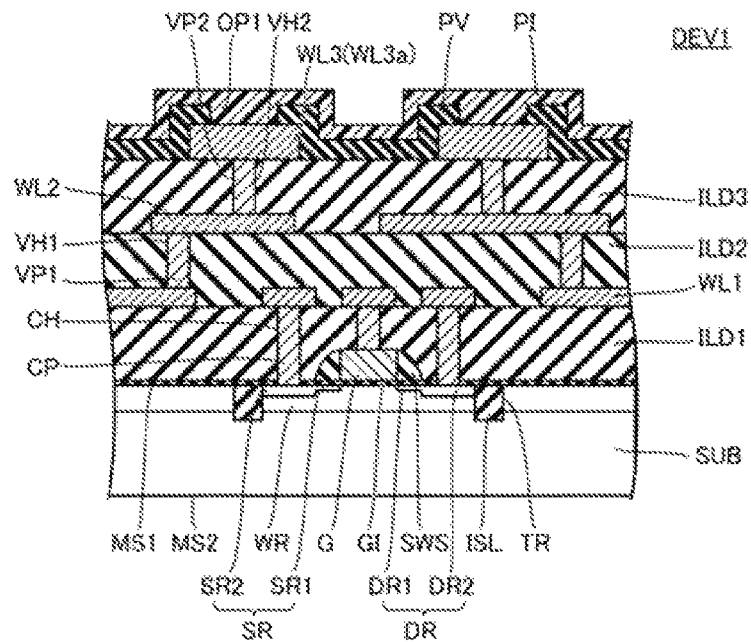

FIG. 25 is a cross-sectional view of the semiconductor device DEV1 according to a second modification of the first embodiment. FIG. 25 indicates a cross section at a position corresponding to FIG. 2. As shown in FIG. 25, the semiconductor device DEV1 may further include a polyimide film PI. The polyimide film PI is disposed over the passivation film PV. The dummy opening OP1 is also filled with the polyimide film PI. Accordingly, it is possible to prevent, the crack which is caused by a stress applied from a mold resin when the semiconductor device DEV1 is packaged from developing from the dummy opening OP1.

Third Modification

Figure 26:
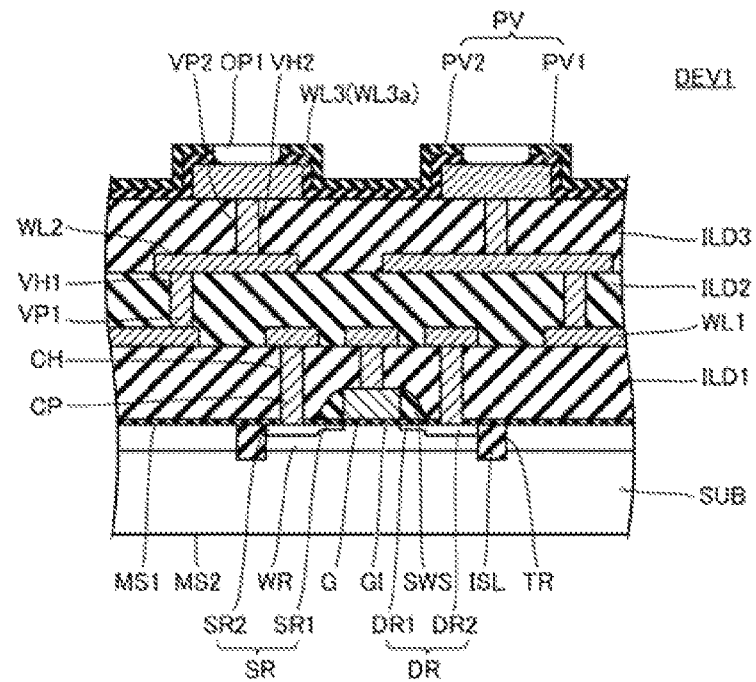

FIG. 26 is a cross-sectional view of the semiconductor device DEV1 according to a third modification of the first embodiment. FIG. 26 indicates a cross section at a position corresponding to FIG. 2. As shown in FIG. 26, the passivation film PV may include a first layer PV1 and a second layer PV2. The first layer PV1 is disposed over the interlayer insulating film ILD3 so as to cover the wirings WL3. The second layer PV2 is disposed over the first layer PV1. The first layer PV1 is formed of, for example, silicon oxide. The second layer PV2 is formed of, for example, silicon nitride. Also in this case, it is possible to stop the crack CL1 with the dummy opening OP1 before the developing direction of the crack CL1 changes. In addition, a film forming temperature of the first layer PV1 formed of silicon oxide is lower than a film forming temperature of the second layer PV2 formed of silicon nitride. Hence, in this case, it is possible to prevent a temperature rise of the wirings WL3 when the passivation film PV is formed.

Second Embodiment

A semiconductor device according to a second embodiment will be described. The semiconductor device according to the second embodiment is referred to as a semiconductor device DEV3. Here, differences between the semiconductor device DEV3 and the semiconductor device DEV1 will mainly be described, and the repetitive description thereof will be omitted.

Configuration of Semiconductor Device DEV3

Hereinafter, a configuration of the semiconductor device DEV3 Will be described.

The semiconductor device DEV3 includes a semiconductor substrate SUB, an element isolation film ISL, a gate insulating film GI, a gate G, sidewall spacers SWS, an interlayer insulating film ILD1, contact plugs wirings WL1, an interlayer insulating film ILD2, via plugs VP1, wirings WL2, an interlayer insulating film ILD3, via plugs VP2, wirings WL3, and a passivation film PV. In regard to this point, the configuration of the semiconductor device DEV3 is common to the configuration of the semiconductor device DEV1.

Figure 27:
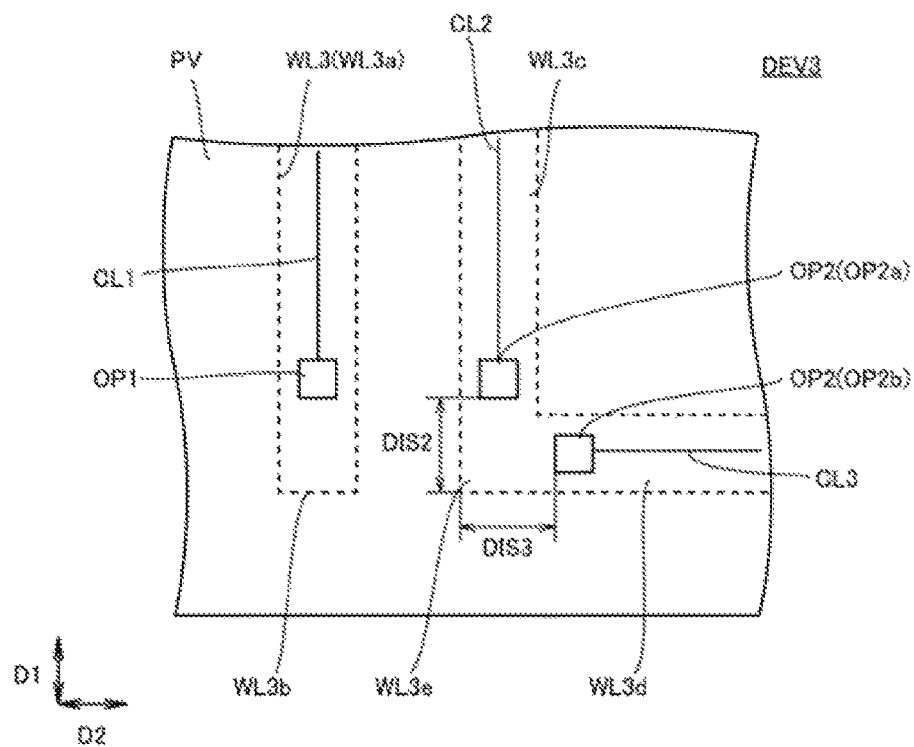

FIG. 27 is a plan view of the semiconductor device DEV3 according to the second embodiment of the present disclosure. As shown in FIG. 27, in the semiconductor device DEV3, the wiring WL3 has a linear portion WL3c and a linear portion WL3d. In the semiconductor device DEV3, dummy openings OP2 are formed in the passivation film PV. In regard to these points, the configuration of the semiconductor device DEV3 is different from the configuration of the semiconductor device DEV1.

The linear portion WL3c extends in a linear manner along the first direction D1, in plan view. The linear portion WL3d extends in a linear manner along the second direction D2, in plan view. The linear portion WL3c and the linear portion WL3d are connected with each other in a contact portion WL3e. The respective dummy openings OP2 are disposed in such a manner as to overlap with an end portion of the linear portion WL3c that is located on the contact portion WL3e side and an end portion of the linear portion WL3d that is located on the contact portion WL3e side, in plan view. Each of the dummy openings OP2 may be disposed in such a manner as to overlap with both the contact portion WL3e and the linear portion WL3c (or the linear portion WL3d). Each of the dummy openings OP2 has a rectangular shape, for example, in plan view.

The dummy opening OP2 disposed in such a manner as to overlap with the end portion of the linear portion WL3c that is located on the contact portion WL3e side is set as a dummy opening OP2a. The dummy opening OP2 disposed in such a manner as to overlap with the end portion of the linear portion WL3d that is located on the contact portion WL3e side is set as a dummy opening OP2b. Any one of the dummy opening OP2a and the dummy opening OP2b may not be formed. A distance between an end of the contact portion WL3e on an opposite side of the linear portion WL3c and the dummy opening OP2a in the first direction D1 is set as a distance DIS2. A distance between an end of the contact portion WL3e on an opposite side of the linear portion WL3d and the dummy opening OP2b in the second direction D2 is set as a distance DIS3. The distance DIS2 and the distance DIS3 are 2.0 µm or more and 2.7 µm or less, for example.

Effect of Semiconductor Device DEV3

In the following, an effect of the semiconductor device DEV3 will be described.

When a temperature cycle is applied to the semiconductor device DEV3, due to a difference in coefficient of thermal expansion between each of the wirings WL3 and the passivation film PV, a crack CL2 (crack CL3) may occur in a portion of the passivation film PV covering the linear portion WL3c (linear portion WL3d). The crack CL2 (crack CL3) develops along the first direction D1 (second direction D2) and advances toward the contact portion WL3e.

When the crack CL2 (crack CL3) reaches the contact portion WL3e, the developing direction of the crack CL2 (crack CL3) may change, and the crack CL2 (crack CL3) may develop toward a side surface of the wiring WL3. However, in the semiconductor device DEV3, the dummy opening OP2a (dummy opening OP2b) is formed in the passivation film PV, and accordingly, the dummy opening OP2a (dummy opening OP2b) can stop the development of the crack CL2 (crack CL3) before the developing direction of the crack CL2 (crack CL3) changes.

In a case in which the distance DIS2 (distance DIS3) is 2.0 µm or more and 2.7 µm or less, it is possible to stop the development of the crack CL2 (crack CL3) more reliably before the developing direction of the crack CL2 (crack CL3) changes.

First Modification

Figure 28:
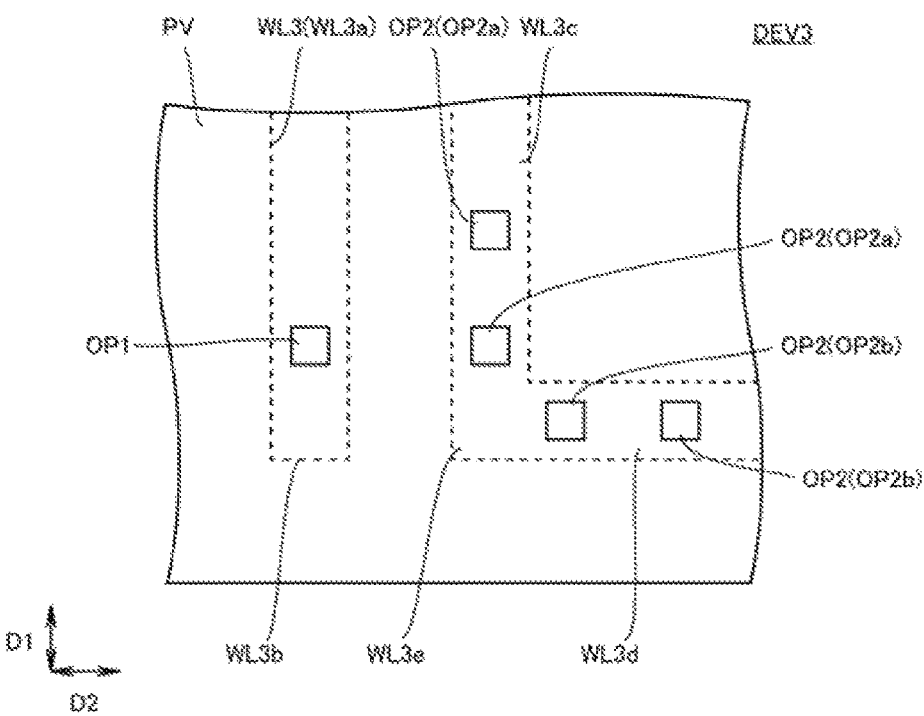

FIG. 28 is a plan view of the semiconductor device DEV3 according to a first modification of the second embodiment. As shown in FIG. 28, the number of the dummy opening OP2a and the dummy opening OP2b may be plural. A plurality of the dummy openings OP2a may preferably be arranged in such a manner as to line up in the first direction D1. Alternatively, a plurality of the dummy openings OP2b may preferably be arranged in such a manner as to line up in the second direction D2.

Second Modification

Figure 29:
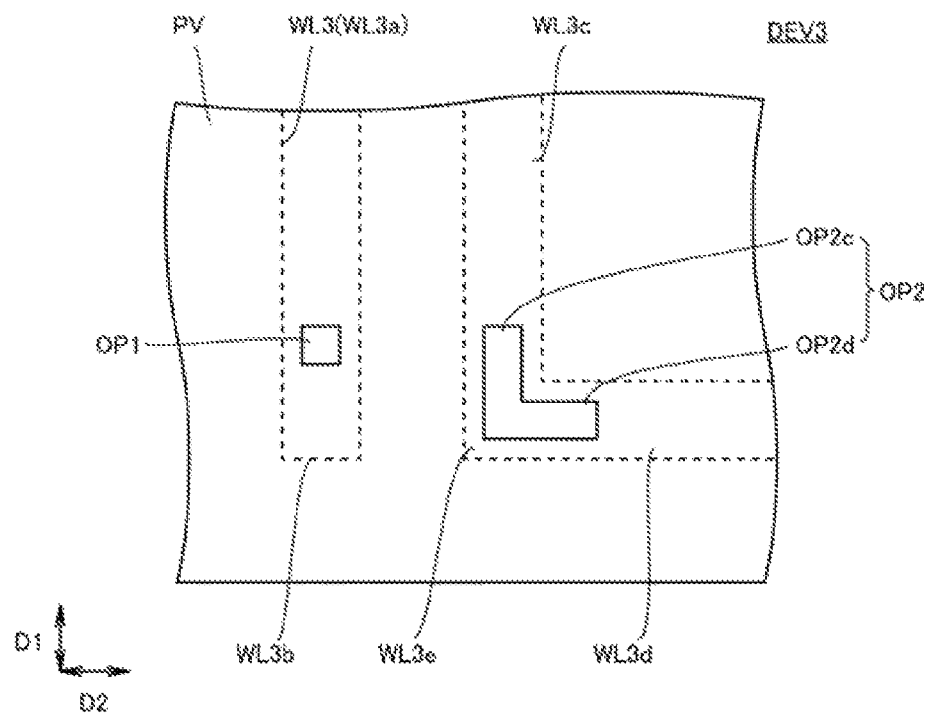
FIG. 29 is a plan view of the semiconductor device according to a second modification of the second embodiment.

FIG. 29 is a plan view of the semiconductor device DEV3 according to a second modification of the second embodiment. As shown in FIG. 29, the dummy opening OP2 may be in a L-letter shape, in plan view. More specifically, the dummy opening OP2 has a first portion OP2c and a second portion OP2d. The first portion OP2c extends along the first direction D1. One end of the first portion OP2c in the first direction D1 and the other end of the first portion OP2c in the first direction D1 overlap with the contact portion WL3e and the linear portion WL3c, respectively.

The second portion OP2d extends along the second direction D2. One end of the second portion OP2d in the second direction D2 and the other end of the second portion OP2d in the second direction D2 overlap with the contact portion WL3e and the linear portion WL3d, respectively. The one end of the first portion OD2c in the first direction D1 and the one end of the second portion OP2d in the second direction D2 are connected with each other.

Third Embodiment

A semiconductor device according to a third embodiment will be described. The semiconductor device according to the third embodiment is referred to as a semiconductor device DEV4. Here, differences between the semiconductor device DEV4 and the semiconductor device DEV3 will mainly be described, and the repetitive description thereof will be omitted.

Configuration of Semiconductor Device DEV4

Hereinafter, the configuration of the semiconductor device DEV4 will be described.

The semiconductor device DEV4 includes a semiconductor substrate SUB, an element isolation film ISL, a gate insulating film GI, a gate G, sidewall spacers SWS, an interlayer insulating film ILD1, contact plugs CP, wirings WL1, an interlayer insulating film ILD2, via plugs VP1, wirings WL2, an interlayer insulating film ILD3, via plugs VP2, wirings WL3, and a passivation film PV. In the semiconductor device DEV4, the passivation film PV has a dummy opening OP1 and dummy openings OP2 (a dummy opening OP2a and a dummy opening OP2b) formed therein. In regard to these points, the configuration of the semiconductor device DEV4 is common to the configuration of the semiconductor device DEV3.

Figure 30:
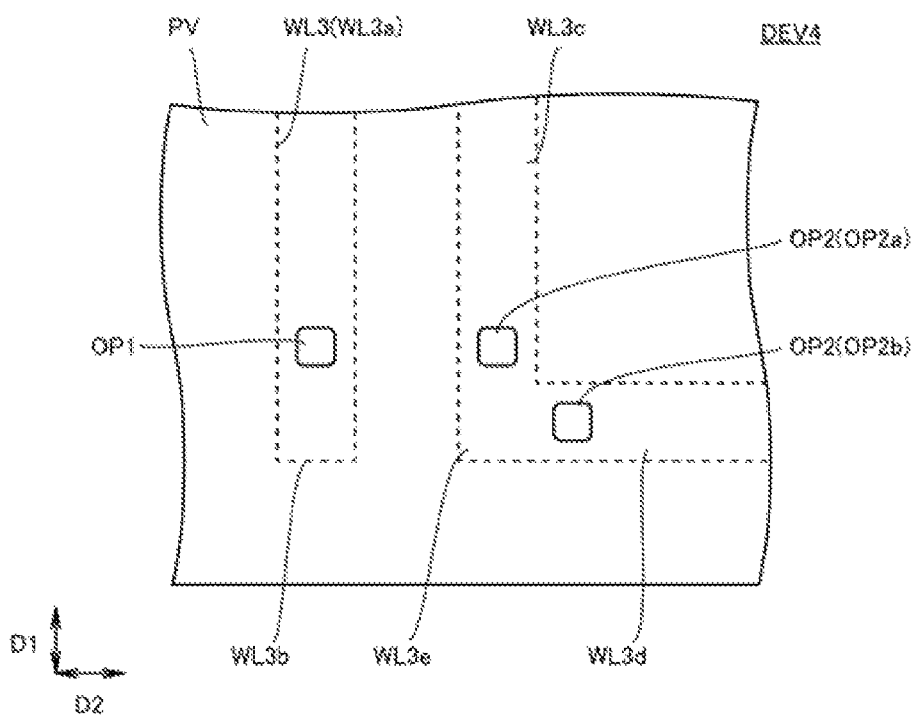
FIG. 30 is a plan view of a semiconductor device according to a third embodiment of the present disclosure.

FIG. 30 is a plan view of the semiconductor device DEV4 according to the third embodiment of the present disclosure. As shown in FIG. 30, corners of an opening edge of each of the dummy opening OP1 and the dummy openings OP2 are rounded. In regard to this point, the configuration of the semiconductor device DEV4 is different from the configuration of the semiconductor device DEV3.

Effect of Semiconductor Device DEV4

In the following, an effect of the semiconductor device DEV4 will be described.

The semiconductor device DEV4 may be used by being sealed with a mold resin (that is, packaged), in some cases. Due to shrinkage of this mold resin or the like, a stress may be applied to the opening edge of each of the dummy opening OP1 and the dummy openings OP2. In the semiconductor device DEV4, since the corners of the opening edge of each of the dummy opening OP1 and the dummy openings OP2 are rounded, the crack is less likely to develop from the corners when this stress is applied to the opening edge.

Fourth Embodiment

A semiconductor device according to a fourth embodiment will be described. The semiconductor device according to the fourth embodiment is referred to as a semiconductor device DEV5, Here, differences between the semiconductor device DEV5 and the semiconductor device DEV3 will mainly be described, and the repetitive description thereof will be omitted.

Configuration of Semiconductor Device DEV5

In the following, a configuration of the semiconductor device DEV5 will be described.

The semiconductor device DES includes a semiconductor substrate SUB, an element isolation film ISL, a gate insulating film GI, a gate G, sidewall spacers SWS, an interlayer insulating film ILD1, contact plugs CP, wirings WL1, an interlayer insulating film ILD2, via plugs VP1, wirings WL2, an interlayer insulating film ILD3, via plugs VP2, wirings WL3, and a passivation film PV. In the semiconductor device DEV5, the passivation film PV has a dummy opening OP1 and dummy openings OP2 (a dummy opening OP2a and a dummy opening OP2b) formed therein. In regard to these points, the configuration of the semiconductor device DEV5 is common to the configuration of the semiconductor device DEV3.

Figure 31:
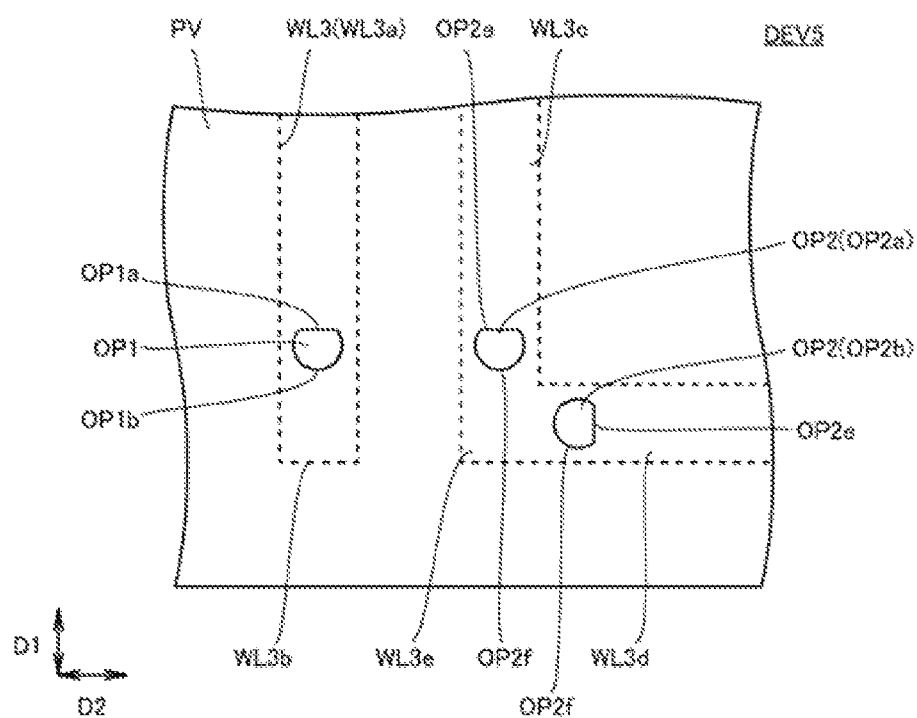
FIG. 31 is a plan view of a semiconductor device according to a fourth embodiment of the present disclosure.

FIG. 31 is a plan view of the semiconductor device DEV5 according to the fourth embodiment of the present disclosure. As shown in FIG. 31, in the semiconductor device DEV5, an opening edge of the dummy opening OP1 includes a straight portion OP1a and a curved portion OP1b. Also, in the semiconductor device DEV5, an opening edge of each of the dummy openings OP2 includes a straight portion OP2e and a curved portion OP2f.

The straight portion OP1a extends along a direction intersecting with the first direction D1, in plan view. The straight portion OP1a preferably extends along the second direction D2, in plan view. The straight portion OP1a is preferably present on the opposite side of the termination portion WL3b. The curved portion OP1b is a partially arc-shaped portion, for example, in plan view. Note that, however, the curved portion OP1b may not be a partially arc-shaped portion, in plan view.

The straight portion OP2e of the dummy opening OP2a extends along the direction intersecting with the first direction D1, in plan view. The straight portion OP2e of the dummy opening OP2a preferably extends along the second direction D2, in plan view. The straight portion OP2e of the dummy opening OP2a is present on the opposite side of the contact portion WL3e.

The straight portion OP2e of the dummy opening OP2b extends along a direction intersecting with the second direction D2, in plan view. The straight portion OP2e of the dummy opening OP2b preferably extends along the first direction D1, in plan view. The straight portion OP2e of the dummy opening OP2b is preferably present to the opposite side of the contact portion WL3e.

A curved portion OP2f of the dummy opening OP2a and a curved portion OP2f of the dummy opening OP2b are partially arc-shaped portions, in plan view, for example. Note that, however, the curved portion OP2f of the dummy opening OP2a and the curved portion OP2f of the dummy opening OP2b may not be partially arc-shaped portions, in plan view. In regard to these points, the configuration of the semiconductor device DEV5 is different from the configuration of the semiconductor device DEV3.

Effect of Semiconductor Device DEV5

In the followings, an effect of the semiconductor device DEV5 will be described.

For a purpose of eliminating concentration of a stress on the opening edge of each of the dummy opening OP1 and the dummy openings OP2, it can be considered that the opening edge of each of the dummy opening OP1 and the dummy openings OP2 is made to be circular, in plan view. However, in this case, when the resist is patterned by photolithography in the opening formation step S18, an opening in the resist is caused to be off-centered, and consequently, the dummy opening OP1 and the dummy openings OP2 may be caused to be off-centered as well. When the dummy opening OP1 and the dummy openings OP2 are caused to be off-centered, the crack CL1, the crack CL2, and the crack CL3 deviate from the dummy opening OP1 and the dummy openings OP2, respectively, and accordingly, each of the crack CL1, the crack CL2, and the crack CL3 may reach the side surface of the wiring WL3, in some case.

However, in the semiconductor device DEV5, the dummy opening OP1 and the dummy openings OP2 have the straight portion OP1a and the straight portion OP2e, respectively, and as a result, when the resist is patterned by photolithography in the opening formation step S18, the opening in the resist is less likely to be off-centered.

In a case in which the straight portion OP1a extends in the direction intersecting with the first direction D1 and is located on the opposite side of the termination portion WL3b, it is possible to receive the crack CL1 in the straight portion OP1a. Hence, in this case, it is possible to further prevent the crack CL1 from deviating from the dummy opening OP1.

In a case in which the straight portion OP2e of the dummy opening OP2a extends in the direction intersecting with the first direction D1 and is located on the opposite side to the contact portion WL3e, it is possible to receive the crack CL2 in the straight portion OP2e of the dummy opening OP2a. Also, in a case in which the straight portion OP2e of the dummy opening OP2b extends in the first direction D1 and is located on the opposite side to the contact portion WL3e, it is possible to receive the crack CL3 in the straight portion OP2e of the dummy opening OP2b. Hence, in these cases, it is possible to further prevent the crack CL2 and crack CL3 from deviating from the dummy openings OP2.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
   a semiconductor substrate having a first main surface and a second main surface that is an opposite surface of the first main surface;
   a plurality of wirings which are layered over the first main surface in a thickness direction that is a direction extending from the second main surface to the first main surface; and
   a passivation film which covers a top wiring that is a wiring being at a farthest position from the first main surface in the thickness direction, of the plurality of wirings,
   wherein the top wiring has a first linear portion linearly extending along a first direction from a termination portion of the top wiring in plan view,
   wherein the passivation film has a first dummy opening formed therein, the first dummy opening penetrating the passivation film in the thickness direction,
   wherein the first dummy opening is disposed so as to be spaced apart from the termination portion and overlap with an end portion of the first linear portion on the termination portion side, in plan view,
   wherein the semiconductor device further comprises a polyimide film disposed over the passivation film, and
   wherein the first dummy opening is filled with the polyimide film.

2. The semiconductor device according to claim 1, wherein a distance between the first dummy opening and the termination portion in the first direction is 2.0 μm or more and 2.7 μm or less.

3. The semiconductor device according to claim 1, wherein a width of the top wiring is 2.0 times or more and 3.4 times or less a thickness of the top wiring.

4. The semiconductor device according to claim 3, wherein the thickness of the top wiring is 3.0 μm or more.

5. The semiconductor device according to claim 1, wherein corners of an opening edge of the first dummy opening in plan view is rounded.

6. The semiconductor device according to claim 5, wherein the first linear portion is located at a position opposite to the termination portion, in plan view.

7. The semiconductor device according to claim 1, wherein an opening edge of the first dummy opening has a straight portion extending along a direction intersecting with the first direction and a curved portion connected with the straight portion, in plan view.

8. The semiconductor device according to claim 1, wherein an opening width of the first dummy opening in a second direction orthogonal to the first direction, in plan view, is larger than 2.0 times a thickness of the passivation film and smaller than a width of the top wiring.

9. The semiconductor device according to claim 1, wherein the top wiring is formed of aluminum or an aluminum alloy.

10. The semiconductor device according to claim 1, wherein the passivation film is formed of silicon nitride or silicon oxynitride.

11. The semiconductor device according to claim 1,
wherein the passivation film has a first layer covering the top wiring, and a second layer disposed over the first layer,
wherein the first layer is formed of silicon oxide, and
wherein the second layer is formed of silicon nitride.

* * * * *